(12) United States Patent
Kim

(10) Patent No.: US 12,107,077 B2
(45) Date of Patent: *Oct. 1, 2024

(54) STACK PACKAGES INCLUDING SUPPORTER

(71) Applicant: SK hynix Inc., Icheon-si (KR)

(72) Inventor: Tae Hoon Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/103,968

(22) Filed: Jan. 31, 2023

(65) Prior Publication Data

US 2023/0170332 A1 Jun. 1, 2023

Related U.S. Application Data

(63) Continuation of application No. 17/203,354, filed on Mar. 16, 2021, now Pat. No. 11,600,599.

(30) Foreign Application Priority Data

Oct. 12, 2020 (KR) .......................... 10-2020-0130909

(51) Int. Cl.
*H01L 25/065* (2023.01)

(52) U.S. Cl.
CPC .. *H01L 25/0657* (2013.01); *H01L 2225/0651* (2013.01); *H01L 2225/06575* (2013.01); *H01L 2225/06582* (2013.01); *H01L 2225/06593* (2013.01)

(58) Field of Classification Search
CPC ....... H01L 2225/06562; H01L 25/0652; H01L 2225/1017
See application file for complete search history.

(56) References Cited

U.S. PATENT DOCUMENTS 9,985,000 B2 5/2018 Ye et al.
2021/0050309 A1* 2/2021 Chang .................... H01L 23/16

* cited by examiner

*Primary Examiner* — Yu-Hsi D Sun
(74) *Attorney, Agent, or Firm* — WILLIAM PARK & ASSOCIATES LTD.

(57) ABSTRACT

A stack package is disclosed. A first semiconductor die and a supporter are disposed on a package substrate. The supporter may include a second side facing a first side of the first semiconductor die having a substantially inclined surface. A second semiconductor die is stacked on the first semiconductor die and on the supporter. An encapsulant layer is formed to fill a portion between the supporter and the first semiconductor die.

10 Claims, 16 Drawing Sheets

STACK PACKAGES INCLUDING SUPPORTER

CROSS-REFERENCE TO RELATED APPLICATIONS

The present application is a continuation application of U.S. patent application Ser. No. 17/203,354, filed on Mar. 16, 2021, and claims priority under 35 U.S.C. 119(a) to Korean Application No. 10-2020-0130909, filed on Oct. 12, 2020, which is incorporated herein by reference in its entirety.

BACKGROUND

1. Technical Field

The present disclosure generally relates to a packaging technology and, more particularly, to stack packages including supporters.

2. Related Art

Various attempts have been made to integrate a plurality of semiconductor dies into one package structure. A stack package structure in which another semiconductor die is vertically stacked on one semiconductor die has been proposed. While a plurality of elements are embedded in the stack package, a gap between the embedded elements may be filled with an encapsulant.

SUMMARY

An aspect of the present disclosure presents a stack package including: a first semiconductor die disposed on a package substrate; a supporter disposed on the package substrate and having a second side facing a first side of the first semiconductor die, the second side having a substantially inclined surface; a second semiconductor die stacked on the first semiconductor die and on the supporter; and an encapsulant layer filling a portion between the supporter and the first semiconductor die.

An aspect of the present disclosure presents a stack package including: a first semiconductor die disposed on a package substrate; a supporter disposed on the package substrate and having a second side facing a first side of the first semiconductor die, the second side including a first sub-side portion and a second sub-side portion that form a staircase shape, the second sub-side portion being spaced apart from the first side of the first semiconductor die by a second interval narrower than a first interval by which the first sub-side portion is spaced apart from the first side of the first semiconductor die; a second semiconductor die stacked on the first semiconductor die and on the supporter; and an encapsulant layer filling a portion between the supporter and the first semiconductor die.

An aspect of the present disclosure presents a stack package including: a first semiconductor die disposed on a package substrate; a supporter disposed on the package substrate and having a second side facing a first side of the first semiconductor die, the second side including a first sub-side portion and a second sub-side portion, the first sub-side portion being an inclined surface spaced apart from the first side of the first semiconductor die by a first interval gradually narrowing, and the second sub-side portion being spaced parallel to the first side by a second interval narrower than the first interval; a second semiconductor die stacked on the first semiconductor die and on the supporter; and an encapsulant layer filling a portion between the supporter and the first semiconductor die.

Another aspect of the present invention presents a stack package including: a first semiconductor die disposed on a package substrate; a supporter disposed on the package substrate and having a second side facing a first side of the first semiconductor die, wherein the second side of the supporter is variably configured; a second semiconductor die stacked on the first semiconductor die and on the supporter; and an encapsulant layer filling a portion between the supporter and the first semiconductor die.

DETAILED DESCRIPTION

Figure 1:
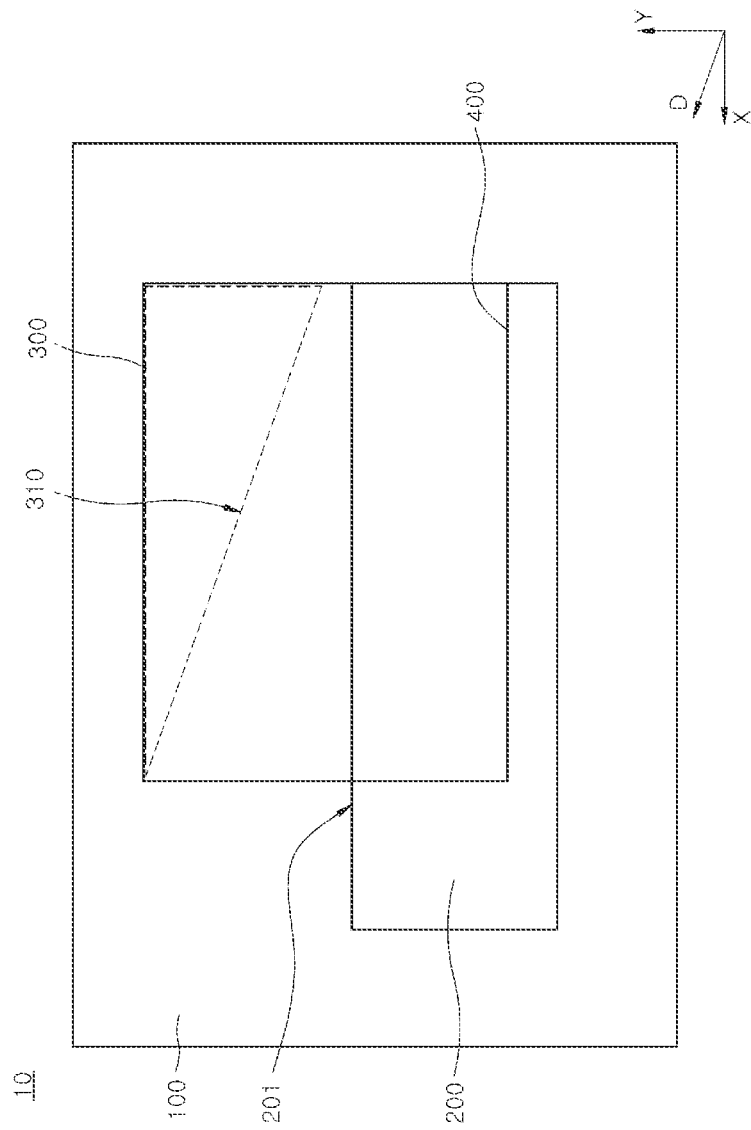
FIG. 1 is a schematic plan view illustrating a stack package according to an embodiment of the present disclosure.

The meanings of the terms used in the various embodiments may be construed according to commonly understood meanings by one with ordinary skill in the art to which the embodiments belong. Unless otherwise defined, the terms used herein have the same meaning as commonly understood by one of ordinary skill in the art to which the embodiments belong.

In the description of the examples of the present disclosure, the terms such as "first" and "second", "top" and "bottom or lower" are intended to distinguish the elements, but are not used to limit the elements or to mean specific order. These terms mean a relative positional relationship, but do not limit the specific case where another element is further introduced at or directly in contact with the element. The same interpretation may be applied to other expressions describing the relationship between elements.

Hereinafter, various examples of embodiments will be described below with reference to the accompanying drawings. Various examples of the embodiments are described herein with reference to cross-sectional illustrations that are schematic illustrations of the various examples of the embodiments and intermediate structures. As such, variations from the shapes of the illustrations as a result, for example, of manufacturing techniques and/or tolerances, are to be expected. Thus, the embodiments should not be construed as limited to the particular shapes of regions illustrated herein but may be construed to include deviations in shapes that result, for example, from manufacturing. In the drawings, lengths and sizes of layers and regions may be exaggerated for clarity. Like reference numerals in the drawings may denote like elements. It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" may encompass both an orientation of above and below. The device may be otherwise oriented (rotated 90 degrees or at other orientations) and the spatially relative descriptors used herein should be interpreted accordingly.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Embodiments of the present disclosure may be applied to a technical field for implementing integrated circuits such as dynamic random-access memory (DRAM) devices, phase change random access memory (PCRAM) devices, or resistive random-access memory (ReRAM) devices. In addition, embodiments of the present disclosure may be applied to a technical field for implementing memory devices such as static random access memory (SRAM) devices, flash memory devices, magnetic random access memory (MRAM) devices or ferroelectric random access memory (FeRAM) devices, or a technical field for implementing a logic device in which a logic integrated circuit is integrated. Embodiments of the present disclosure may be applied to a technical field for implementing various products requiring fine patterns.

The same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a schematic plan view illustrating a stack package 10 according to an embodiment of the present disclosure.

Referring to FIG. 1, the stack package 10 according to an embodiment may include a package substrate 100, a first semiconductor die 200, a supporter 300, and a second semiconductor die 400. The first semiconductor die 200 and the second semiconductor die 400 may be semiconductor dies in which memory devices are integrated. The first semiconductor die 200 and the second semiconductor die 400 may be different types of semiconductor dies. The second semiconductor die 400 may have a size different from that of the first semiconductor die 200. The package substrate 100 may be a wiring structure that electrically connects the first and second semiconductor dies 200 and 400 to an external device. The package substrate 100 may be provided in the form of a printed circuit board (PCB) or an interposer.

Figure 11:
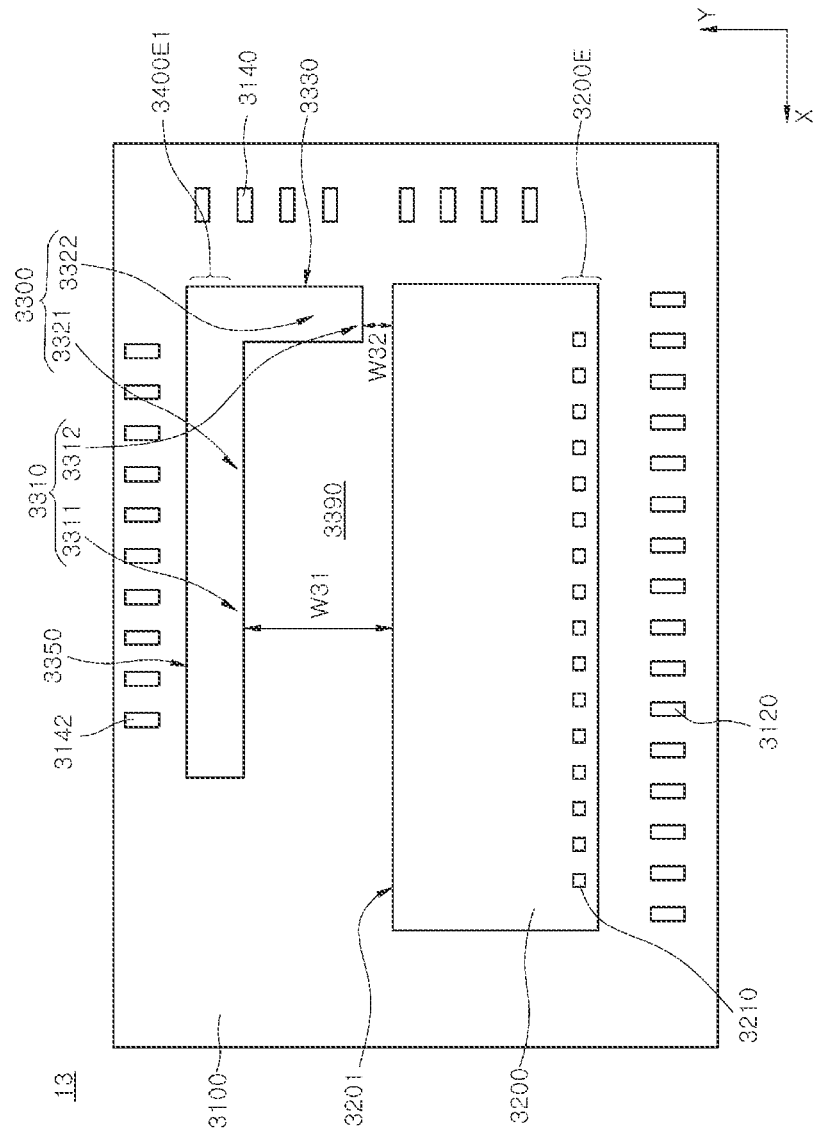
FIG. 11 is a schematic plan view illustrating an arrangement shape of a supporter of the stack package of FIG. 10.
Figure 15:
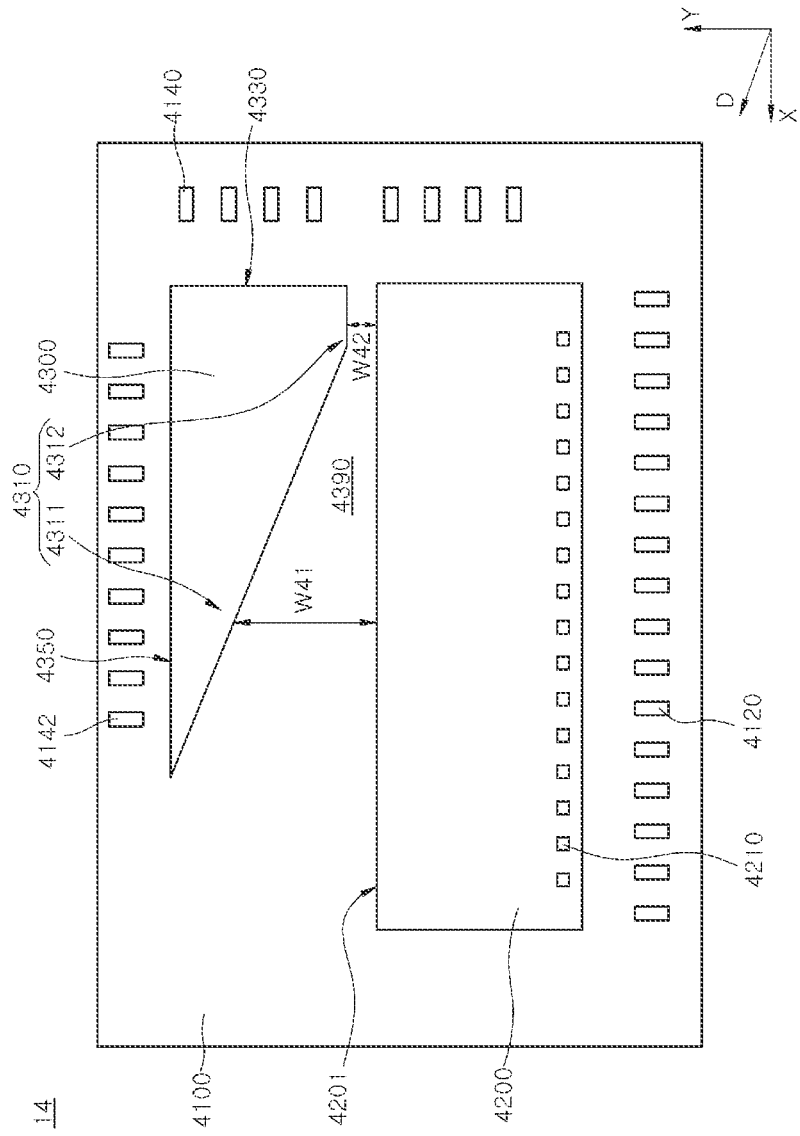
FIG. 15 is a schematic plan view illustrating one embodiment of a configuration of a supporter of the stack package of FIG. 14.

The first semiconductor die 200 may be disposed on the package substrate 100. The supporter 300 may be disposed on the package substrate 100 while being laterally spaced apart from the first semiconductor die 200. The supporter 300 may include a second side 310 facing a first side 201 of the first semiconductor die 200, wherein the second side 310 is variably configured. The variably configured second side 310 of the supporter may be a substantially inclined surface, for example, as illustrated in FIG. 1. That is, for example, the substantially inclined surface may be uneven or undulating while still being substantially inclined. Alternatively, as illustrated in FIG. 15, the second side 310 of the supporter may be partially inclined for a predetermined portion, with a remaining portion being parallel to the first side 4201 of the first semiconductor. In yet another embodiment, as illustrated in FIG. 11, the supporter may be in a substantially "L" shape, with the second side of the supporter that faces the first side of the first semiconductor die having a predetermined portion of the second side of the supporter being substantially parallel to the first side 3201 of the first semiconductor die and a remaining portion of the second side of the supporter being substantially perpendicular to the first side 3201 of the first semiconductor die. Hence, in addition to other variable configurations, the second side 310 of the supporter may be one of substantially inclined with respect to the first side of the second semiconductor die as illustrated in FIG. 1, partially inclined to the first side of the first semiconductor die for a predetermined portion and substantially parallel to the first side 4201 of the first semiconductor die for a remaining portion as illustrated in FIG. 15, and in a substantially "L" shape, with the second side of the supporter that faces the first side of the first semiconductor die having a predetermined portion of the second side of the supporter being substantially parallel to the first side 3201 of the first semiconductor die and a remaining portion of the second side of the supporter being substantially perpendicular to the first side 3201 of the first semiconductor die as illustrated in FIG. 11. The second side 310 of the supporter 300 may be a side extending along an inclination direction D. The inclination direction D may be a direction extending between the X-axis direction and the Y-axis direction orthogonal thereto in the X-Y plane. The inclination direction D may be a direction having an angle greater than 0 degree (°) and less than 90 degrees (°) with respect to the X-axis direction. The first side 201 of the first semiconductor die 200 may be a side extending along the X-axis direction. The supporter 300 and the first semiconductor die 200 may be disposed at the same height level on the package substrate 100. The second semiconductor die 400 may be stacked while straddling the first semiconductor die 200 and the supporter 300 together. The second semiconductor die 400 may be supported by the first semiconductor die 200 and the supporter 300 together. The second semiconductor die 400 may contact the first semiconductor die 200 and the supporter 300 at the same time.

Figure 2:
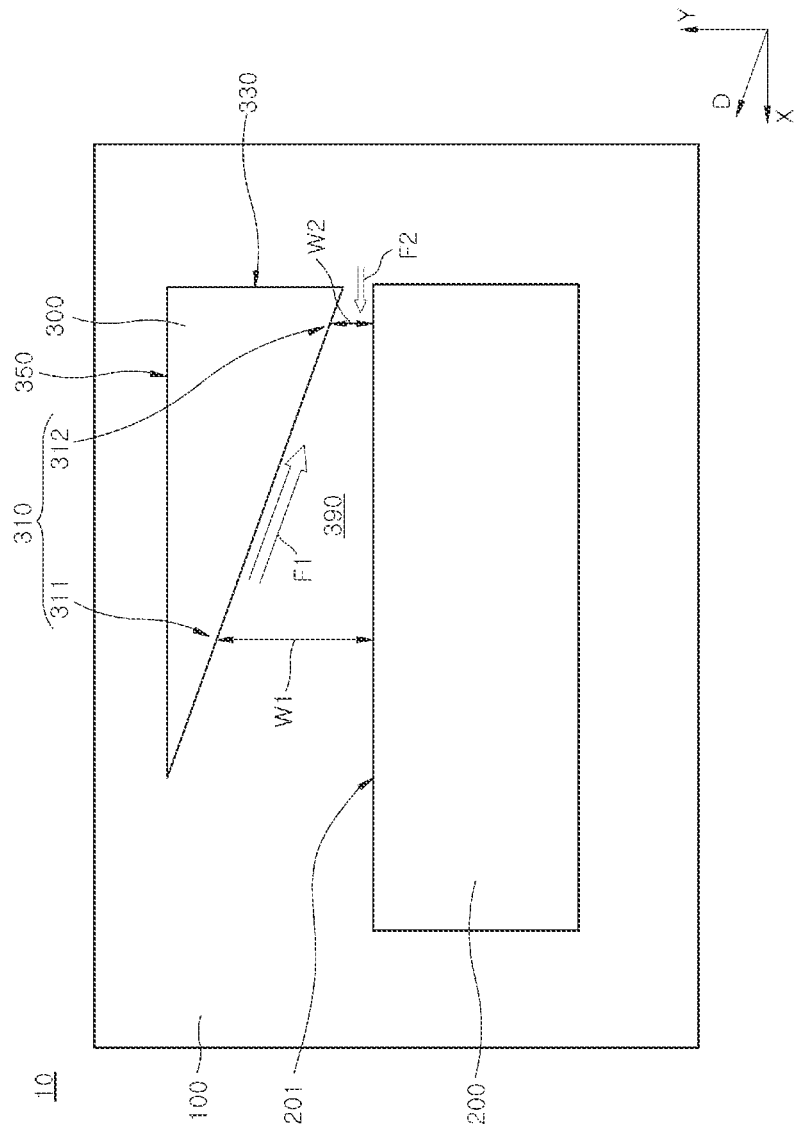
FIG. 2 is a schematic plan view illustrating an arrangement shape of a supporter of the stack package of FIG. 1.

FIG. 2 is a schematic plan view illustrating an embodiment of a configuration of the supporter 300 of the stack package 10 of FIG. 1.

Referring to FIG. 2, the first side 201 of the first semiconductor die 200 is a flat side, and the second side 310 of the supporter is an inclined surface. The inclined surface may be a side extending along a direction between an X-axis and a Y-axis in an X-Y plane. The first side 201 of the first semiconductor die 200 may extends along the X-axis. The first side 201 of the first semiconductor die 200 may be a side that is parallel to the X-axis direction and orthogonal to the Y-axis direction. Because the second side 310 of the supporter 300 is an inclined surface extending along the inclination direction D, the second side 310 may be extended to intersect with the X-axis or the Y-axis. In other words, the separation distance between the first side 201 of the first semiconductor die 200 and the second side 310 of the supporter 300 may increase substantially constantly or decrease substantially constantly along the first side 201 of the first semiconductor die 200. The second side 310 of the supporter 300 may include a first sub-side portion 311 and a second sub-side portion 312.

The first sub-side portion 311 of the second side 310 may be positioned to be spaced apart from the first side 201 of the first semiconductor die 200 by a first interval W1. The second sub-side portion 312 of the second side 310 of the supporter 300 may be spaced apart from the first side 201 of the first semiconductor die 200 by a second interval W2. The second interval W2 may be relatively narrower than the first interval W1. In this way, the second side 310 of the supporter 300 may have an inclined surface whose separation distance may be substantially uniformly increased when traveling from the second interval W2 to the first interval W1.

The supporter 300 may have a triangular shape or a triangular plate shape including the second side 310, a third side 330, and a fourth side 350. The third side 330 of the supporter 300 may be a side connected to the second side 310, and the fourth side 350 may be a side connecting the second side 310 and the third side 330. The supporter 300 may be disposed next to the first semiconductor die 200 so that the fourth side 350 of the supporter 300 may be substantially parallel to the first side 201 of the first semiconductor die 200. The supporter 300 and the first semiconductor die 200 may be disposed so that the extension line of the second side 310 of the supporter 300 and the extension line of the first side 201 of the first semiconductor die 200 cross each other while forming an angle of less than 90 degrees (°).

The supporter 300 may be a kind of semiconductor die cut and separated from a semiconductor wafer. In an embodiment, the supporter 300 may further include a dielectric material or an insulating material. The supporter 300 may be a dummy die. When the supporter 300 is made of a semiconductor material, the supporter 300 may have a thermal expansion coefficient similar to or substantially the same as that of the second semiconductor die 400 or that of the first semiconductor die 200. Accordingly, it is possible to substantially reduce or suppress the stress caused by the difference in thermal expansion coefficient between the semiconductor dies 200 and 400 and the supporter 300 in the stack package 10. Accordingly, thermal stability of the stack package 10 may be improved.

Figure 3:
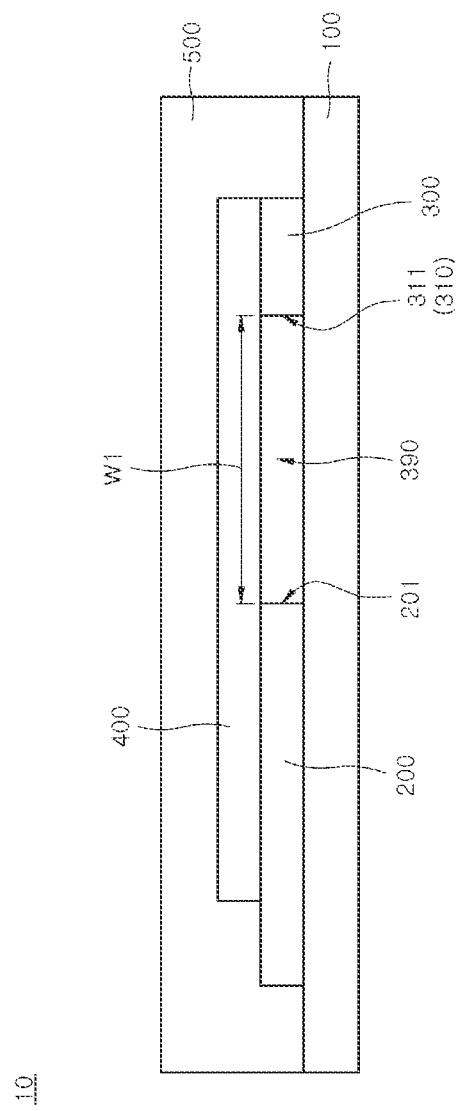
FIGS. 3 and 4 are schematic cross-sectional views illustrating cross-sectional shapes of the stack package of FIG. 1.
Figure 4:
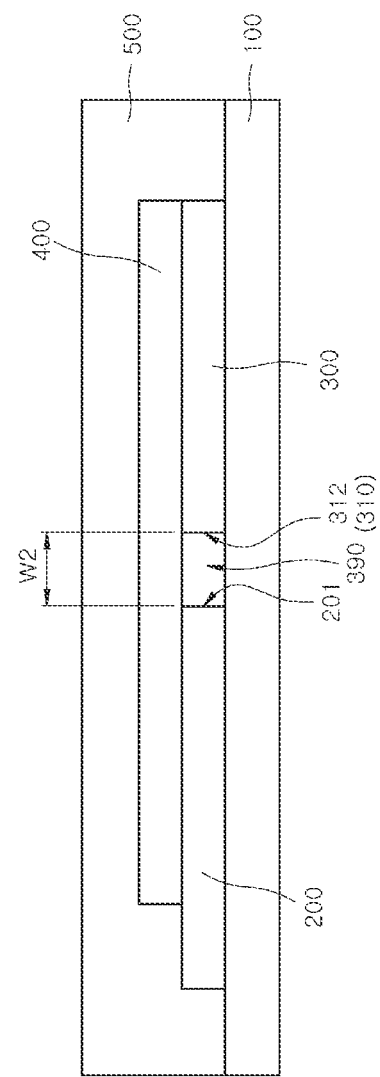

FIGS. 3 and 4 are schematic cross-sectional views illustrating the stack package 10 of FIG. 1. Specifically, FIG. 3 schematically illustrates a cross-sectional shape of the stack package 10 along a cutting line passing through the first sub-side portion 311 of the supporter 300 of FIG. 2. FIG. 4 schematically illustrates another cross-sectional shape of the stack package 10 along a cutting line passing through the second sub-side portion 312 of the supporter 300 of FIG. 2.

Referring to FIGS. 3, 4, and 2, the stack package 10 according to an embodiment may further include an encapsulant layer 500 that covers and protects the first semiconductor die 200, the supporter 300, and the second semiconductor die 400 on the package substrate 100. The encapsulant layer 500 may be formed by a molding process using an epoxy molding compound (EMC).

The encapsulant forming the encapsulant layer 500 in the molding process may flow between the first semiconductor die 200 and the supporter 300 to fill a separation space 390 between the first semiconductor die 200 and the supporter 300. Because the second semiconductor die 400 is disposed so as to straddle the first semiconductor die 200 and the supporter 300, the separation space 390 may overlap with the second semiconductor die 400 and might not be exposed. Accordingly, the encapsulant may flow from the portion of the package substrate 100 that does not overlap with the second semiconductor die 400 in a direction parallel to the substrate surface to fill the separation space 390.

The encapsulant may flow along a first flow direction (F1 in FIG. 2) from a portion where the first interval W1 is located to another portion where the second interval W2 is located to fill the separation space 390. The encapsulant may flow along a second flow direction (F2 in FIG. 2) from the portion where the second interval W2 is located to the portion where the first interval W1 is located to fill the separation space 390.

Because the first interval W1 is relatively wider than the second interval W2, the encapsulant may flow into or flow out smoothly without being substantially stagnated around the first sub-side portion 311 where the first interval W1 is located. Filling defects in which voids are trapped in the encapsulant layer 500 around the first sub-side portion 311 may be substantially prevented, reduced, or suppressed. The flowable encapsulant may flow along the slope of the inclined surface of the second side 310. The encapsulant may flow into the separation space 390 while maintaining a stable flow without actual occurrence of turbulence. Accordingly, the encapsulant may substantially fill the separation space 390 between the first semiconductor die 200 and the supporter 300 without generating voids.

The second interval W2 may correspond to a relatively narrow separation distance, but the second sub-side portion 312 providing the second interval W2 may be limited to have a shorter length than the entire second side 310. Because the second sub-side portion 312 is limited to have a relatively short length, the encapsulant may flow smoothly from the separation space 390 near the second sub-side portion 312 without stagnation despite the narrow second interval W2. As such, because the second sub-side portion 312 is limited to have a relatively short length with respect to the second side 310, the stagnation of the flow of the encapsulant in the vicinity of the second sub-side portion 312 may be substantially prevented, reduced, or suppressed. Because the encapsulant in the vicinity of the second sub-side portion 312 may flow into or flow out smoothly, filling defects in which voids are trapped in the encapsulant layer 500 around the second sub-side portion 312 may be substantially prevented, reduced, or suppressed.

Figure 5:
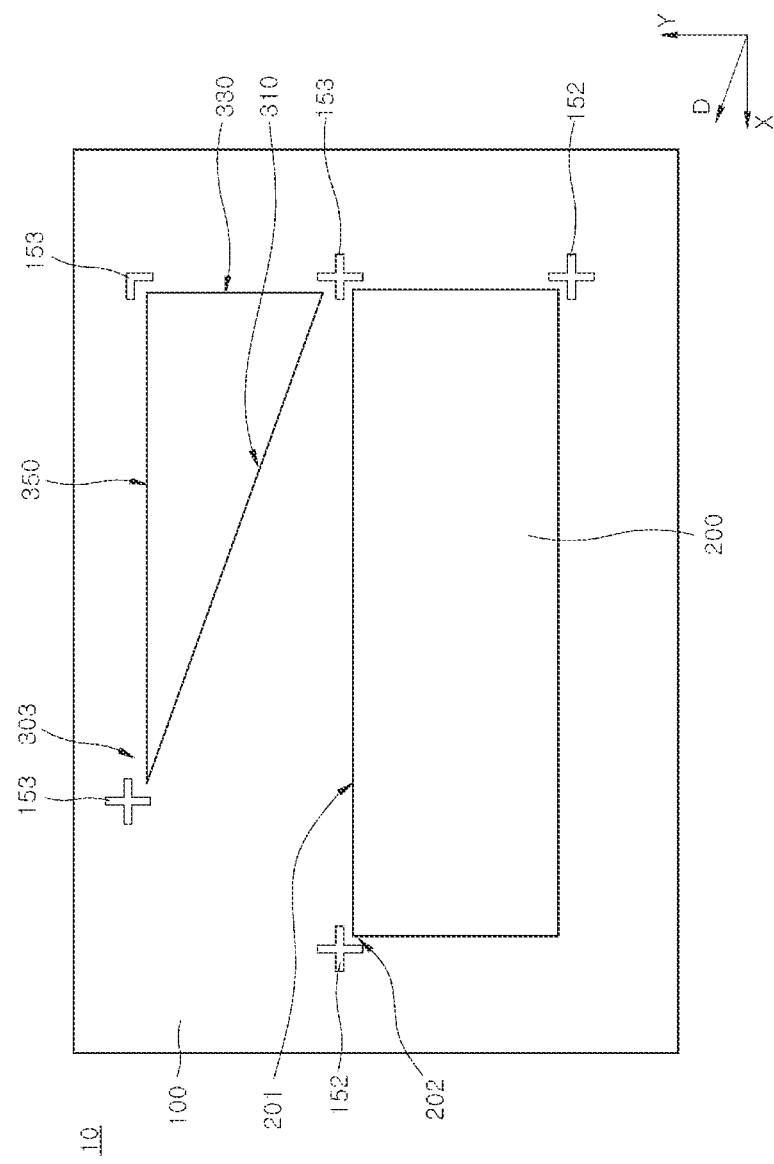
FIG. 5 is a schematic plan view illustrating a planar arrangement shape of location marks of the stack package of FIG. 1.

FIG. 5 is a schematic plan view illustrating a planar shape in which positioning marks 152 and 153 are disposed on the package substrate 100 of the stack package 10 of FIG. 1.

Referring to FIG. 5, first positioning marks 152 and second positioning marks 153 may be disposed on the package substrate 100. The first positioning marks 152 may be provided as patterns indicating a location where the first semiconductor die 200 is to be disposed when the first semiconductor die 200 is mounted on the package substrate 100. The first positioning marks 152 may be disposed around corner portions 202 of the first semiconductor die 200. The second positioning marks 153 may be provided as patterns indicating a location where the supporter 300 is to be disposed when the supporter 300 is mounted on the package substrate 100. The second positioning marks 153 may be disposed around corner portions 303 of the supporter 300. The second positioning marks 153 may be disposed around a corner portion where the second side 310 and the third side 330 of the supporter 300 meet, a corner portion where the third side 330 and the fourth side 350 meet, and a corner portion where the second side 310 and the fourth side 350 are connected. The positioning marks 152 and 153 may be provided as patterns of a cross-shape or a bracket-shape.

Figure 6:
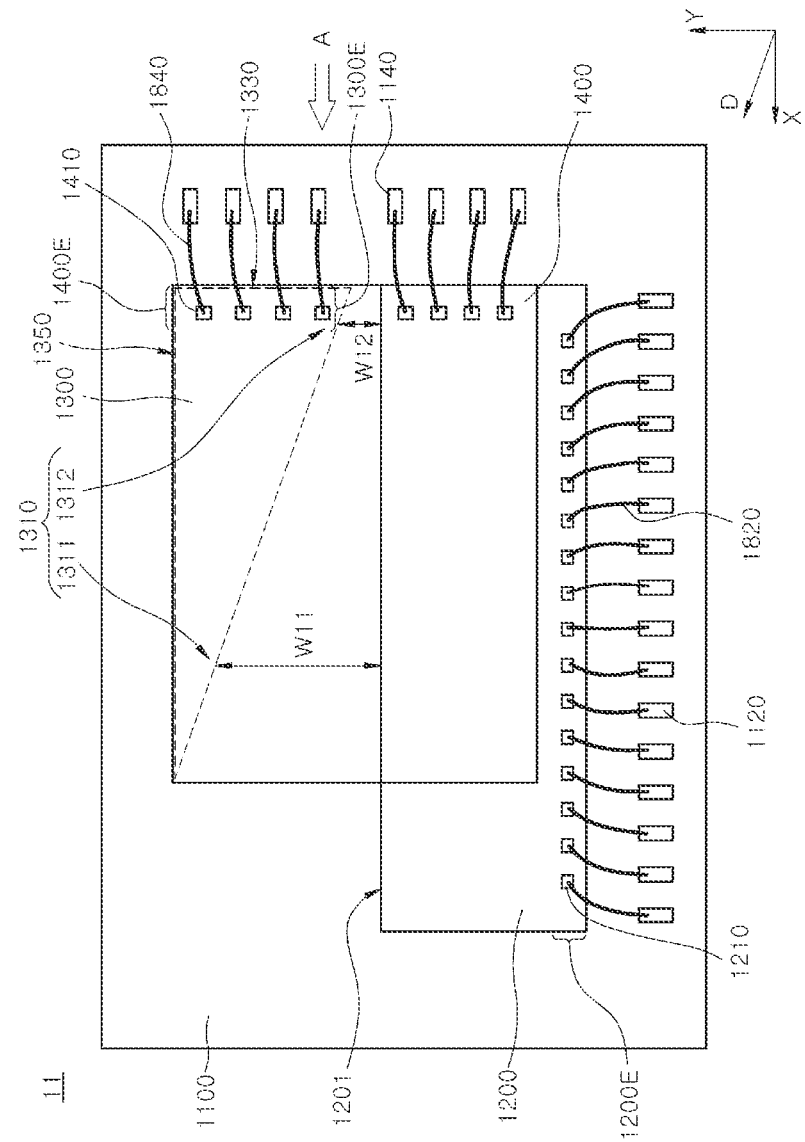
FIG. 6 is a schematic plan view illustrating a stack package according to an embodiment of the present disclosure.
Figure 7:
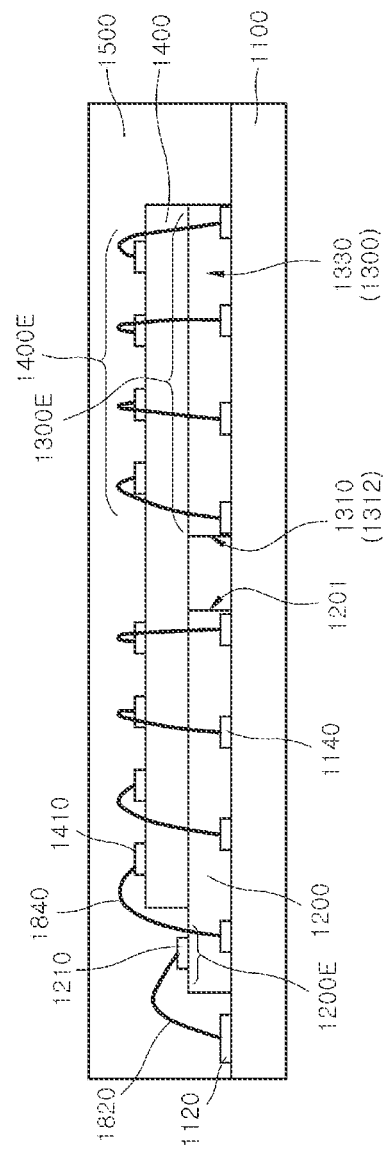
FIG. 7 is a schematic side view of the stack package of FIG. 6 viewed from one side direction.

FIG. 6 is a schematic plan view illustrating a stack package 11 according to an embodiment of the present disclosure. FIG. 7 is a schematic side view of the stack package 11 of FIG. 6 viewed from direction "A".

Referring to FIGS. 6 and 7, the stack package 11 according to an embodiment may include a package substrate 1100, a first semiconductor die 1200, a supporter 1300, and a second semiconductor die 1400. The stack package 11 may further include an encapsulant layer 1500 that encapsulates the first semiconductor die 1200, the supporter 1300, and the second semiconductor die 1400 on the package substrate 1100. The second semiconductor die 1400 may be stacked while straddling the first semiconductor die 1200 and the supporter 1300 together.

The supporter 1300 may have a shape in which a second side 1310 facing a first side 1201 of the first semiconductor die 1200 includes an inclined surface. The second side 1310 of the supporter 1300 may include a first sub-side portion 1311 and a second sub-side portion 1312. The first sub-side portion 1311 of the supporter 1300 may be spaced apart from the first side 1201 of the first semiconductor die 1200 by a first interval W11, and the second sub-side portion 1312 of the supporter 1300 may be spaced apart from the first side 1201 of the first semiconductor die 1200 by a second interval W12 that is narrower than the first interval W11. The supporter 1300 may further include a third side 1330 and a fourth side 1350. The fourth side 1350 of the supporter 1300 may be a side substantially parallel to the first side 1201 of the first semiconductor die 1200. The third side 1330 of the supporter 1300 may be a side connecting the fourth side 1350 and the second side 1310. The supporter 1300 may have a shape of a triangular plate.

The second semiconductor die 1400 may include first bonding pads 1410. The first bonding pads 1410 may be arranged at a first edge portion 1400E of the second semiconductor die 1400. The first bonding pads 1410 of the second semiconductor die 1400 may be connecting terminals that electrically connect an integrated circuit integrated in the second semiconductor die 1400 to the package substrate 1100. The first edge portion 1400E of the second semiconductor die 1400 may be overlapped with the supporter 1300 disposed under the second semiconductor die 1400. The second semiconductor die 1400 may be disposed so that the first bonding pads 1410 overlap with the supporter 1300. The first edge portion 1400E of the second semiconductor die 1400 may include a region of the second semiconductor die 1400, adjacent to the third side 1330 of the supporter 1300. The first edge portion 1400E of the second semiconductor die 1400 may be further extended to be overlapped with the first semiconductor die 1200 disposed under the second semiconductor die 1400. The first bonding pads 1410 may be arranged in a row in the first edge portion 1400E of the second semiconductor die 1400.

First bonding fingers 1140 respectively corresponding to the first bonding pads 1410 may be arranged on the package substrate 1100. First bonding wires 1840 may electrically and physically connect the first bonding pads 1410 to the first bonding fingers 1140. Each of the first bonding wires 1840 may be bonded to each of the first bonding pads 1410 through a wire bonding process. In order to bond an end of the first bonding wire 1840 to the first bonding pad 1410, a process of pressing an end of the first bonding wire 1840 against the first bonding pad 1410 may be involved. In the press bonding process, pressure may be applied to first bonding pads 1410 that are disposed on a portion of the second semiconductor die 1400.

If the portion where the first bonding pads 1410 of the second semiconductor die 1400 are located is not supported by the supporter 1300, the portion where the first bonding pads 1410 of the second semiconductor die 1400 are located may be pressed and deflected by the pressing pressure. As such, as the portion of the second semiconductor die 1400 where the first bonding pads are located is deflected, a bonding failure may occur in which the first bonding wires are not substantially connected to the first bonding pads.

A third edge portion 1300E of the supporter 1300 may be overlapped with a first edge portion 1400E of the second semiconductor die 1400, and the first bonding pads 1410 may be supported by the third edge portion 1300E of the supporter 1300. When performing the wire bonding process for forming the first bonding wires 1840, the first bonding pads 1410 may be supported by the third edge portion 1300E of the supporter 1300. Accordingly, it is possible to substantially prevent, reduce, or suppress the occurrence of bending of a part of the second semiconductor die 1400 during the wire bonding process or occurrence of bonding failures. The third edge portion 1300E of the supporter 1300 may be a region overlapping with the first edge portion 1400E of the second semiconductor die 1400. The third edge portion 1300E of the supporter 1300 may be a region adjacent to the third side 1330 of the supporter 1300.

The first semiconductor die 1200 may include third bonding pads 1210 arranged in a fifth edge portion 1200E. The package substrate 1100 may include third bonding fingers 1120 corresponding to the third bonding pads 1210. Third bonding wires 1820 may electrically and physically connect the third bonding pads 1210 to the third bonding fingers 1120, respectively.

Figure 8:
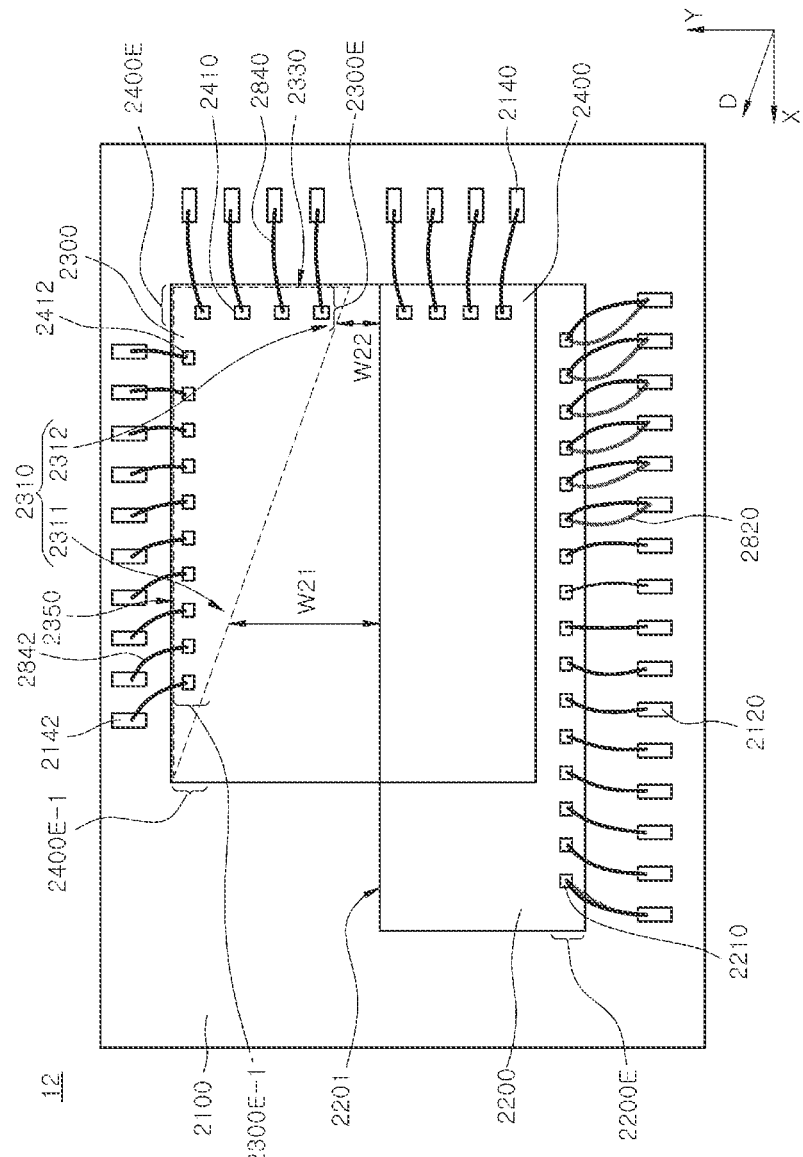
FIG. 8 is a schematic plan view illustrating a stack package according to an embodiment of the present disclosure.
Figure 9:
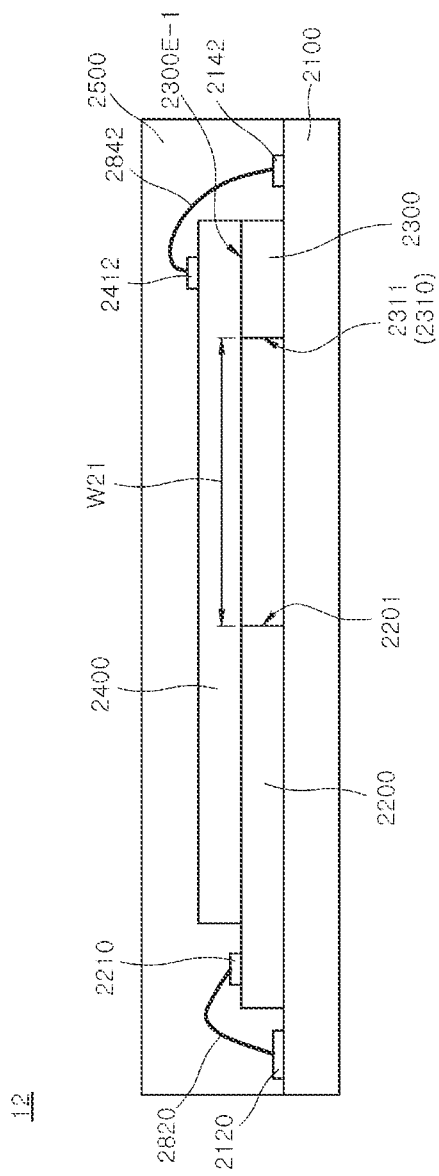
FIG. 9 is a schematic cross-sectional view illustrating a cross-sectional shape of the stack package of FIG. 8.

FIG. 8 is a schematic plan view illustrating a stack package 12 according to an embodiment of the disclosure. FIG. 9 illustrates a schematic cross-sectional shape along a cut line passing through a first sub-side portion 2311 of a supporter 2300 of the stack package 12 of FIG. 8.

Referring to FIGS. 8 and 9, the stack package 12 according to an embodiment may include a package substrate 2100, a first semiconductor die 2200, a supporter 2300, and a second semiconductor die 2400. The stack package 12 may further include an encapsulant layer 2500 that encapsulates the first semiconductor die 2200, the supporter 2300, and the second semiconductor die 2400 on the package substrate 2100. The second semiconductor die 2400 may be stacked while straddling the first semiconductor die 2200 and the supporter 2300 together.

The supporter 2300 may have a shape in which a second side 2310 facing a first side 2201 of the first semiconductor die 2200 includes an inclined surface. The second side 2310 of the supporter 2300 may include a first sub-side portion 2311 and a second sub-side portion 2312. The first sub-side portion 2311 of the supporter 2300 may be spaced apart from the first side 2201 of the first semiconductor die 2200 by a first interval W21, and the second sub-side portion 2312 may be spaced apart from the first side 2201 of the first semiconductor die 2200 by a second interval W22 that is narrower than the first interval W21. A fourth side 2350 of the supporter 2300 may be a side substantially parallel to the first side 2201 of the first semiconductor die 2200, and a third side 2330 of the supporter 2300 may be a side connecting the fourth side 2350 and the second side 2310. The supporter 2300 may have a shape of a triangular plate.

The second semiconductor die 2400 may include first bonding pads 2410 arranged in a first edge portion 2400E of the second semiconductor die 2400. The first edge portion 2400E of the second semiconductor die 2400 may include a region of the second semiconductor die 2400, adjacent to the third side 2330 of the supporter 2300. As the first edge portion 2400E of the second semiconductor die 2400 is partially overlapped with the supporter 2300, the first bonding pads 2410 may be supported by the supporter 2300. The first bonding pads 2410 may be supported by a third edge portion 2300E of the supporter 2300.

First bonding fingers 2140 respectively corresponding to the first bonding pads 2410 may be arranged on the package substrate 2100. First bonding wires 2840 may be disposed to respectively connect the first bonding pads 2410 to the first bonding fingers 2140 electrically and physically.

The second semiconductor die 2400 may further include second bonding pads 2412 arranged in a second edge portion 2400E-1 of the second semiconductor die 2400. As the second edge portion 2400E-1 of the second semiconductor die 2400 is overlapped with another portion of the supporter 2300, the second bonding pads 2412 may be supported by the supporter 2300. The second bonding pads 2412 may be supported by a fourth edge portion 2300E-1 of the supporter 2300.

The second edge portion 2400E-1 of the second semiconductor die 2400 may include a region of the second semiconductor die 2400, adjacent to the fourth side 2350 of the supporter 2300. The second edge portion 2400E-1 of the second semiconductor die 2400 may be a region orthogonal to the first edge portion 2400E. The second edge portion 2400E-1 of the second semiconductor die 2400 may be overlapped with the fourth edge portion 2300E-1 that is another portion of the supporter 2300. The fourth edge portion 2300E-1 of the supporter 2300 may include a region of the supporter 2300, adjacent to the fourth side 2350.

Second bonding fingers 2142 respectively corresponding to the second bonding pads 2412 may be disposed on the package substrate 2100. Second bonding wires 2842 may be disposed to respectively connect the second bonding pads 2412 and the second bonding fingers 2142 electrically and physically.

Because the first bonding pads 2410 may be supported while being overlapped with the third edge portion 2300E of the supporter 2300, and the second bonding pads 2412 may be supported while being overlapped with the fourth edge portion 2300E-1 of the supporter 2300, it is possible to substantially prevent, reduce, or suppress the occurrence of bonding failure in the wire bonding process used to form the first and second bonding wires 2840 and 2842.

The first semiconductor die 2200 may include third bonding pads 2210 arranged in a fifth edge portion 2200E. The package substrate 2100 may include third bonding fingers 2120 respectively corresponding to the third bonding pads 2210. Third bonding wires 2820 may respectively connect the third bonding pads 2210 to the third bonding fingers 2120 electrically and physically.

Figure 10:
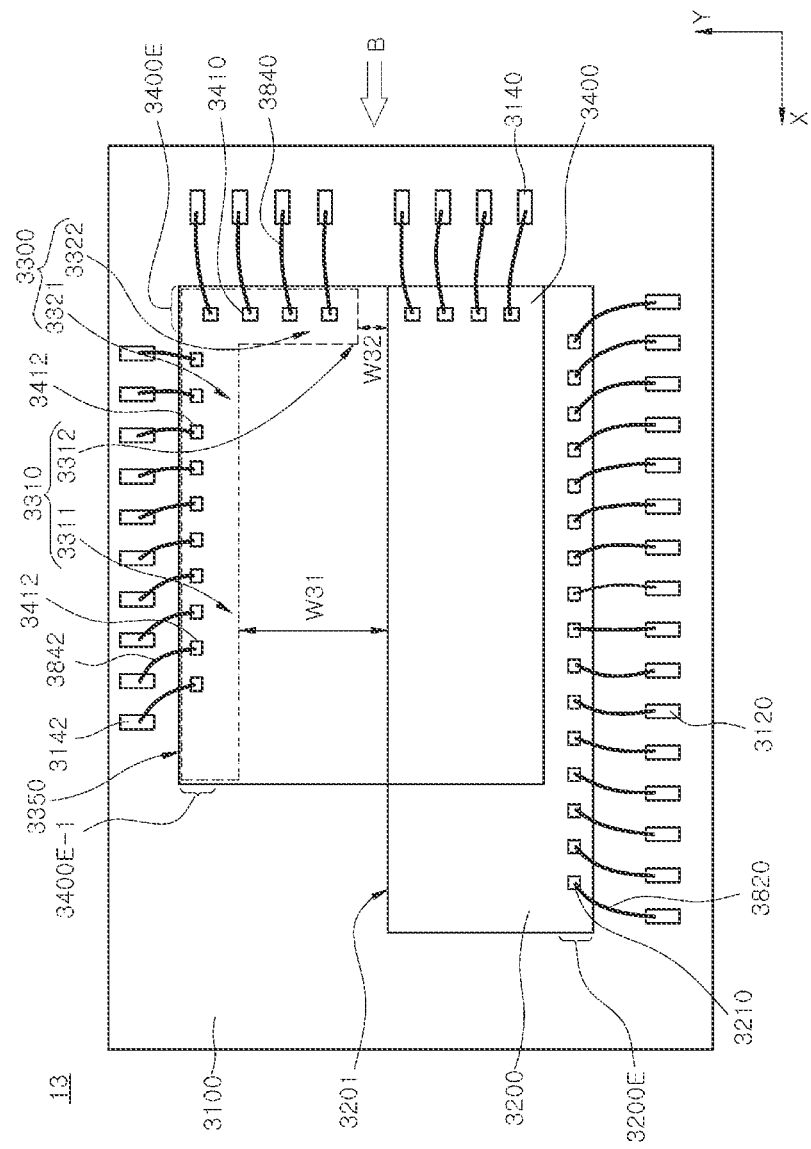
FIG. 10 is a schematic plan view illustrating a stack package according to an embodiment of the present disclosure.
Figure 12:
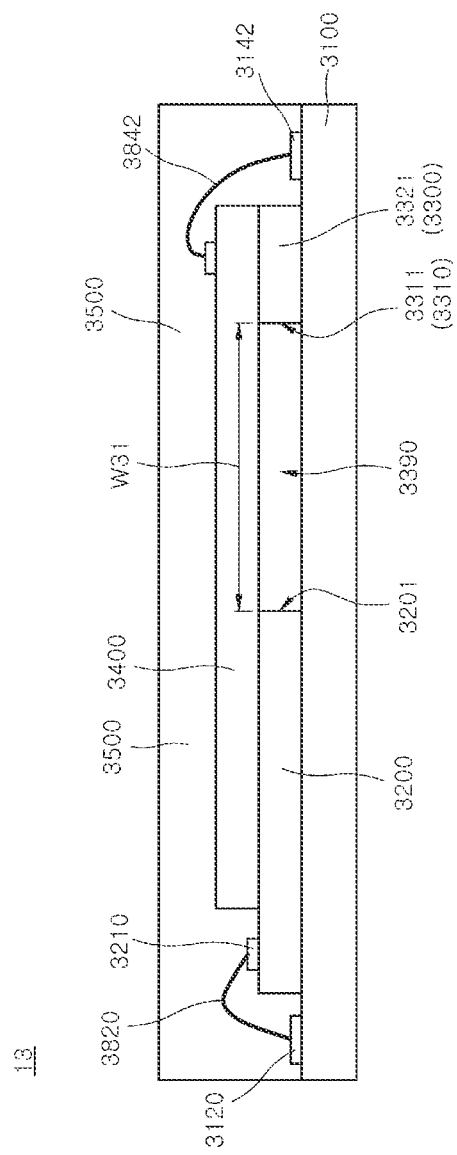
FIG. 12 is a schematic cross-sectional view illustrating a cross-sectional shape of the stack package of FIG. 10.
Figure 13:
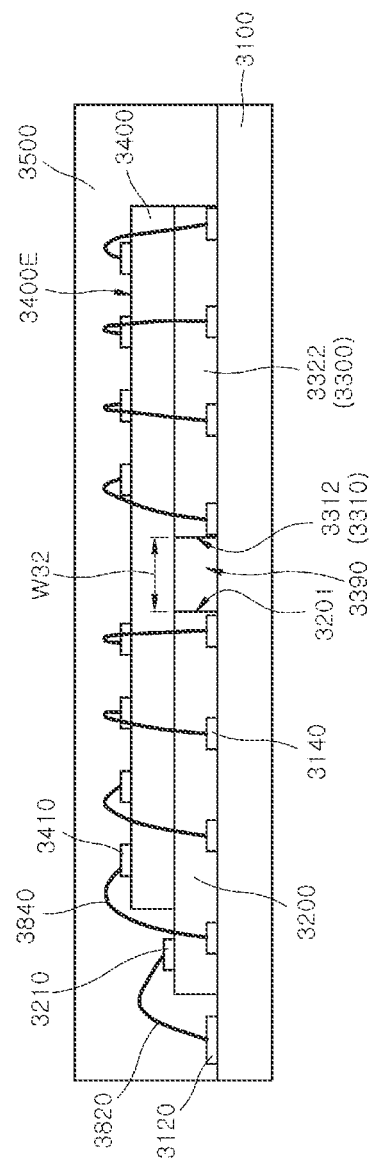
FIG. 13 is a schematic side perspective view of the stack package of FIG. 10 viewed from one side.

FIG. 10 is a schematic plan view illustrating a stack package 13 according to an embodiment of the present disclosure. FIG. 11 is a schematic plan view illustrating an arrangement shape of a supporter 3300 of the stack package 13 of FIG. 10. FIG. 12 is a schematic cross-sectional view illustrating a cross-sectional shape of the stack package 13 along a cut line passing through a first supporter body portion 3321 of the supporter 3300 of FIG. 10. FIG. 13 is a schematic side perspective view of the stack package 13 of FIG. 10 viewed from a direction "B".

Referring to FIGS. 10 and 11, the stack package 13 according to an embodiment may include a package substrate 3100, a first semiconductor die 3200, a supporter 3300, and a second semiconductor die 3400. Referring to FIGS. 12 and 13, the stack package 13 may further include an encapsulant layer 3500 that encapsulates the first semiconductor die 3200, the supporter 3300, and the second semiconductor die 3400 on the package substrate 3100. The second semiconductor die 3400 may be stacked while straddling the first semiconductor die 3200 and the supporter 3300 together.

Referring to FIGS. 10 and 11, in a side view, the supporter may have a shape in which a second side 3310 facing a first side 3201 of the first semiconductor die 3200 forms a staircase shape. The second side 3310 of the supporter 3300 may have a first sub-side portion 3311 and a second sub-side portion 3312. The first sub-side portion 3311 of the supporter 3300 may be spaced apart from a first side 3201 of the first semiconductor die 3200 by a relatively wide first interval W31, and the second sub-side portion 3312 may be spaced apart from the first side 3201 of the first semiconductor die 3200 by a second interval W32 that is narrower than the first interval W31.

The supporter 3300 may include a first supporter body portion 3321 and a second supporter body portion 3322. The first sub-side portion 3311 may be one side of the first supporter body portion 3321 and may be located to face the first side 3201 of the first semiconductor die 3200. The second sub-side portion 3312 may be one side of the second supporter body portion 3322 and may be positioned to face the first side 3201 of the first semiconductor die 3200. The second supporter body portion 3322 may protrude from the first supporter body portion 3321 toward the first semiconductor die 3200, so that the first sub-side portion 3311 and the second sub-side portion 3312 may form a lateral shape of a staircase shape. The second supporter body portion 3322 and the first supporter body portion 3321 may make the supporter 3300 have an "L"-shaped plate shape.

The supporter 3300 may include a fourth side 3350 that is substantially parallel to the first side 3201 of the first semiconductor die 3200, and may include a third side 3330 connecting the fourth side 3350 and the second side 3310.

Referring to FIGS. 10 and 13, the second semiconductor die 3400 may include first bonding pads 3410 disposed at a first edge portion 3400E of the second semiconductor die 3400. The first edge portion 3400E of the second semiconductor die 3400 may include a region of the second semiconductor die 3400, adjacent to the third side 3330 of the supporter 3300. As the first edge portion 3400E of the second semiconductor die 3400 is overlapped with the second supporter body portion 3322, which is a portion of the supporter 3300, the first bonding pads 3410 may be supported by the second supporter body portion 3322.

First bonding fingers 3140 respectively corresponding to the first bonding pads 3410 may be arranged on the package substrate 3100. First bonding wires 3840 may be disposed to respectively connect the first bonding pads 3410 to the first bonding fingers 3140 electrically and physically.

Referring to FIGS. 10 and 12, the second semiconductor die 3400 may further include second bonding pads 3412 disposed in a second edge portion 3400E-1 of the second semiconductor die 3400. The second edge portion 3400E-1 of the second semiconductor die 3400 may be a region adjacent to the fourth side 3350 of the supporter 3300. As the second edge portion 3400E-1 of the second semiconductor die 3400 overlaps the first supporter body portion 3321, which is another portion of the supporter 3300, the second bonding pads 3412 may be supported by the first supporter body portion 3321.

Second bonding fingers 3142 respectively corresponding to the second bonding pads 3412 may be arranged on the package substrate 3100. Second bonding wires 3842 may be disposed to respectively connect the second bonding pads 3412 to the second bonding fingers 3142 electrically and physically.

Because the first bonding pads 3410 may be supported while being overlapped with the second supporter body portion 3322, and the second bonding pads 3412 may be supported while being overlapped with the first supporter body portion 3321, the occurrence of bonding failure may be substantially prevented, reduced, or suppressed in the wire bonding process that forms the first and second bonding wires 3820 and 3842.

The first semiconductor die 3200 may include third bonding pads 3210 arranged in a fifth edge portion 3200E. The package substrate 3100 may include third bonding fingers 3120 respectively corresponding to the third bonding pads 3210. Third bonding wires 3820 may respectively connect the third bonding pads 3210 to the third bonding fingers 3120 electrically and physically.

Referring to FIGS. 11, 12, and 13, the encapsulant that forms the encapsulant layer 3500 in the molding process may flow between the first semiconductor die 3200 and the supporter 3300 to fill the separation space 3390 between the first semiconductor die 3200 and the supporter 3300. The first sub-side portion 3311 of the first supporter body portion 3321 and the first side 3201 of the first semiconductor die 3200 may be spaced apart from each other by a relatively wide first interval W31. Accordingly, it is possible to substantially prevent, reduce, or suppress voids from being trapped between the first supporter body portion 3321 and the first semiconductor die 3200. The second sub-side portion 3312 of the second supporter body portion 3322 and the first side 3201 of the first semiconductor die 3200 may be spaced apart from each other by a second interval W32 that is narrower than the first interval W31. However, the second sub-side portion 3312 may have a significantly shorter length than the first sub-side portion 3311. Accordingly, stagnation of the flow of the encapsulant around the second sub-side portion 3312 may be substantially prevented, reduced, or suppressed. It is possible to substantially prevent, reduce, or suppress voids from being trapped in the encapsulant layer 3500 around the second sub-side portion 3312.

Figure 14:
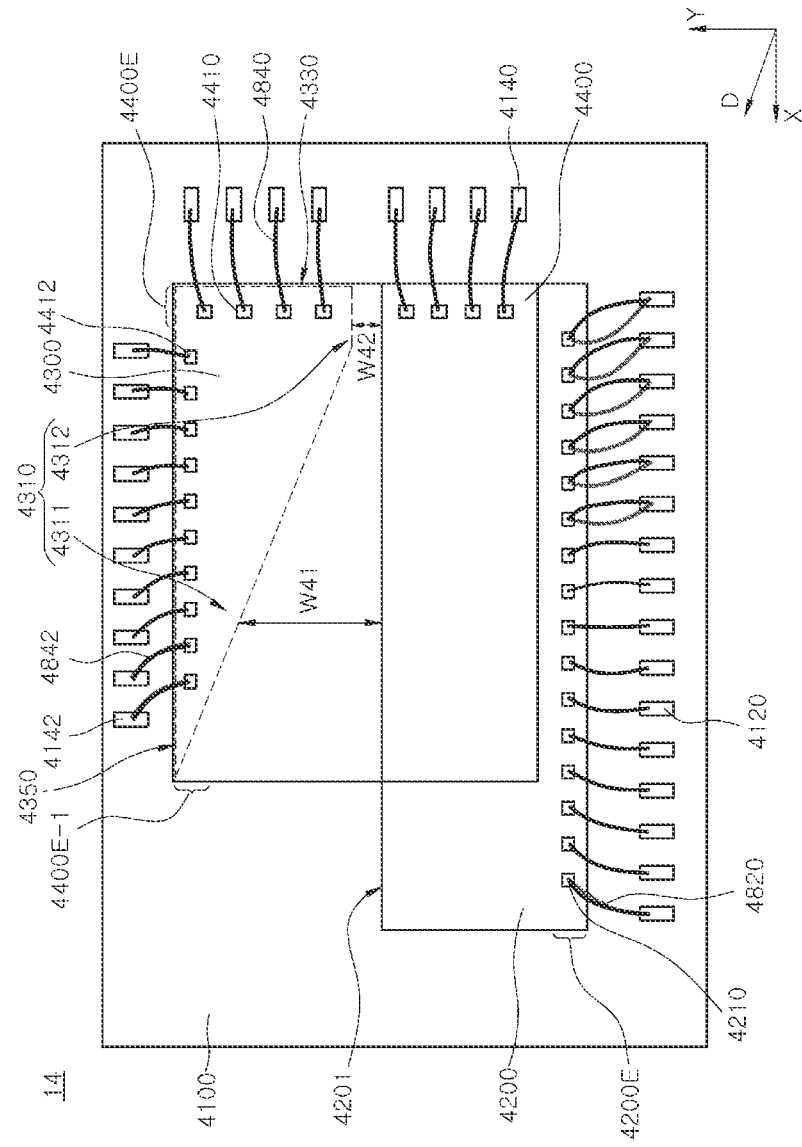
FIG. 14 is a schematic plan view illustrating a stack package according to an embodiment of the present disclosure.

FIG. 14 is a schematic plan view illustrating a stack package 14 according to an embodiment of the disclosure. FIG. 15 is a schematic plan view illustrating one embodiment of a configuration of a supporter 4300 of the stack package 14 of FIG. 14.

Referring to FIGS. 14 and 15, the stack package 14 according to an embodiment may include a package substrate 4100, a first semiconductor die 4200, a supporter 4300, and a second semiconductor die 4400. The stack package 14 may further include an encapsulant layer (not illustrated) that encapsulates the first semiconductor die 4200, the supporter 4300, and the second semiconductor die 4400 on the package substrate 4100. The second semiconductor die 4400 may be stacked while straddling the first semiconductor die 4200 and the supporter 4300 together.

The supporter 4300 may include a second side 4310 facing a first side 4201 of the first semiconductor die 4200, and the second side 4310 may include a first sub-side portion 4311 and a second sub-side portion 4312. The first sub-side portion 4311 of the supporter 4300 may include an inclined surface such that a first interval W41 with the first side 4201 of the first semiconductor die 4200 gradually narrows or increases substantially constantly. The second sub-side portion 4312 of the supporter 4300 may be a side having a second interval W42 with the first side 4201 of the first semiconductor die 4200 being narrower than the first interval W41. The second sub-side portion 4312 of the supporter 4300 may be a side substantially parallel to and spaced apart from the first side 4201 of the first semiconductor die 4200.

The supporter 4300 may include a fourth side 4350 that is substantially parallel to the first side 4201 of the first semiconductor die 4200, and may include a third side 4330 connecting the fourth side 4350 and the second sub-side portion 4312. The supporter 4300 may have a shape of a trapezoidal plate.

The second semiconductor die 4400 may include first bonding pads 4410 arranged in a first edge portion 4400E of the second semiconductor die 4400. The first edge portion 4400E of the second semiconductor die 4400 may include a region of the second semiconductor die 4400, adjacent to the third side 4330 of the supporter 4300. As the first edge portion 4400E of the second semiconductor die 4400 is overlapped with a portion the supporter 4300, the first bonding pads 4410 may be supported by the supporter 4300.

First bonding fingers 4140 respectively corresponding to the first bonding pads 4410 may be arranged on the package substrate 4100. First bonding wires 4840 may be disposed to respectively connect the first bonding pads 4410 to the first bonding fingers 4140 electrically and physically.

The second semiconductor die 4400 may further include second bonding pads 4412 arranged in a second edge portion 4400E-1 of the second semiconductor die 4400. The second edge portion 4400E-1 of the second semiconductor die 4400 may be a region adjacent to the fourth side 4350 of the supporter 4300. As the second edge portion 4400E-1 of the second semiconductor die 4400 is overlapped with another portion of the supporter 4300, the second bonding pads 4412 may be supported by the supporter 4300.

Second bonding fingers 4142 respectively corresponding to the second bonding pads 4412 may be arranged on the package substrate 4100. Second bonding wires 4842 may be disposed to respectively connect the second bonding pads 4412 to the second bonding fingers 4142 electrically and physically.

Because the first bonding pads 4410 and the second bonding pads 4412 may be supported while being overlapped with some portions of the supporter 4300, the occurrence of bonding failure may be substantially prevented, reduced, or suppressed in the wire bonding process to form the first and second bonding wires 4840 and 4842.

The first semiconductor die 4200 may include third bonding pads 4210 arranged in a fifth edge portion 4200E. The package substrate 4100 may include third bonding fingers 4120 corresponding to the third bonding pads 4210. Third bonding wires 4820 may respectively connect the third bonding pads 4210 to the third bonding fingers 4120 electrically and physically.

Referring to FIG. 15, an encapsulant forming the encapsulant layer in the molding process may be introduced between the first semiconductor die 4200 and the supporter 4300, filling a separation space 4390 between the first semiconductor die 4200 and the supporter 4300. The first sub-side portion 4311 of the supporter 4300 may be an inclined surface, and the first side 4201 of the first semiconductor die 4200 may be spaced apart by a relatively wide first interval W41. Accordingly, it is possible to substantially prevent, reduce, and suppress voids from being trapped between the first sub-side portion 4311 and the first semiconductor die 4200. The second sub-side portion 4312 of the supporter 4300 and the first side 4201 of the first semiconductor die 4200 may be separated by a second interval W42 that is narrower than the first interval W41, but the second sub-side portion 4312 may have a significantly shorter length than the first sub-side portion 4311. Accordingly, stagnation of the flow of the encapsulant around the second sub-side portion 4312 may be substantially prevented, reduced, or suppressed. It is possible to substantially prevent, reduce, or suppress voids from being trapped in the encapsulant layer around the second sub-side portion 4312.

Figure 16:
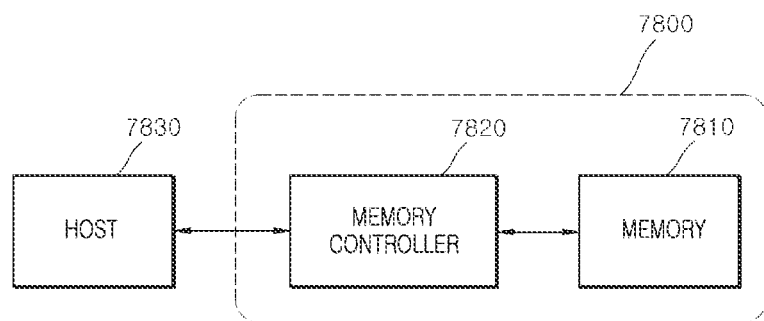
FIG. 16 is a block diagram illustrating an electronic system employing a memory card including a package in accordance with an embodiment of the present disclosure.

FIG. 16 is a block diagram illustrating an electronic system including a memory card 7800 employing at least one of the semiconductor packages according to the embodiments. The memory card 7800 may include a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 17:
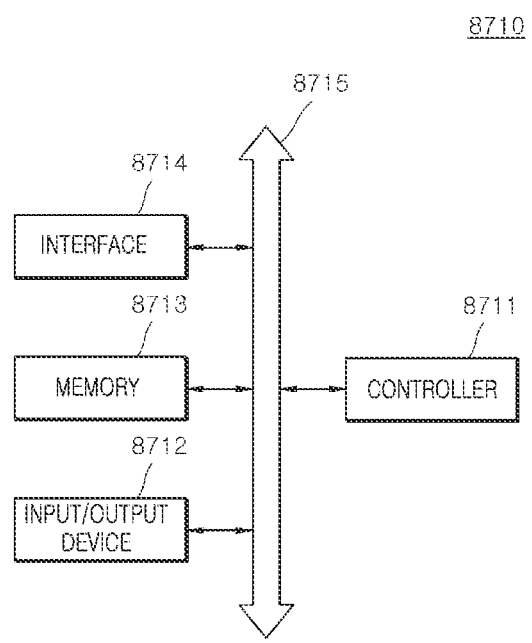
FIG. 17 is a block diagram illustrating an electronic system including a package according to an embodiment of the present disclosure.

FIG. 17 is a block diagram illustrating an electronic system 8710 including at least one of the semiconductor packages according to the embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected from among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A stack package comprising:
a first semiconductor die disposed over a package substrate;

a supporter disposed over the package substrate and having a second side facing a first side of the first semiconductor die;

a second semiconductor die stacked over the first semiconductor die and over the supporter; and an encapsulant layer filling a portion between the supporter and the first semiconductor die, wherein the second side of the supporter is inclined with respect to the first side of the first semiconductor die, and wherein the supporter comprises a third side connected to the second side, and a fourth side connecting the third side and the second side.

2. The stack package of claim 1, wherein a distance between the first side of the first semiconductor die and the second side of the supporter increases or decreases along the first side of the first semiconductor die.

3. The stack package of claim 1, wherein the supporter has a shape of a triangular plate.

4. The stack package of claim 1, wherein the fourth side is parallel to the first side of the first semiconductor die.

5. The stack package of claim 4, wherein the second semiconductor die further comprises first bonding pads disposed in a first edge portion of the second semiconductor die, adjacent to the third side of the supporter, first bonding wires being bonded to the first bonding pads, and wherein the supporter is disposed so that a portion of the supporter overlaps with the first bonding pads.

6. The stack package of claim 4, wherein the second semiconductor die further comprises second bonding pads disposed in a second edge portion of the second semiconductor die, adjacent to the fourth side of the supporter, second bonding wires being bonded to the second bonding pads, and wherein the supporter is disposed so that another portion of the supporter overlaps with the second bonding pads.

7. The stack package of claim 4, wherein the package substrate further comprises positioning marks that are disposed around corner portions connecting the second side and the third side of the supporter, the third side and the fourth side, and the second side and the fourth side to indicate a placement location of the supporter.

8. The stack package of claim 1, wherein the second semiconductor die comprises bonding pads disposed in an edge portion, bonding wires being bonded thereto, and wherein the supporter is disposed so that a portion of the supporter overlaps with the bonding pads.

9. The stack package of claim 1, wherein the supporter comprises semiconductor material.

10. The stack package of claim 1, wherein the second semiconductor die has a different size from the first semiconductor die.

* * * * *